United States Patent [19]
Mantel et al.

[11] Patent Number: 5,602,875
[45] Date of Patent: Feb. 11, 1997

[54] METHOD AND APPARATUS FOR ENCODING AND DECODING INFORMATION IN A DIGTIAL COMMUNICATION SYSTEM

[75] Inventors: G. David Mantel, Plantation; Gregory L. Cannon, Boynton Beach; R. Louis Breeden, Boca Raton, all of Fla.

[73] Assignee: Motorola, Inc., Schaumburg, Ill.

[21] Appl. No.: 372,421

[22] Filed: Jan. 13, 1995

[51] Int. Cl.⁶ .............................. H04L 5/12; H04L 27/12; H04L 27/14
[52] U.S. Cl. .......................... 375/264; 375/272; 375/303; 375/334; 375/340
[58] Field of Search ...................................... 375/264, 265, 375/295, 296, 316, 340, 341, 262, 485, 334, 272, 298, 303, 285; 371/56, 43, 44, 45, 37.1, 38.1, 39.1; 329/300; 332/100

[56] References Cited

U.S. PATENT DOCUMENTS

| | | | |
|---|---|---|---|
| 4,633,486 | 12/1986 | Berlekamp et al. | 375/354 |
| 5,029,185 | 7/1991 | Wei | 375/245 |
| 5,056,112 | 10/1991 | Wei | 375/280 |
| 5,168,493 | 12/1992 | Nelson et al. | 370/84 |

FOREIGN PATENT DOCUMENTS

0264205A2 9/1987 Japan.

OTHER PUBLICATIONS

Castello et al., "Error Control Coding: Fundamentals and Applications," Prentice–Hall, Inc., pp. 65–68.

Primary Examiner—Tesfaldet Bocure
Attorney, Agent, or Firm—R. Louis Breeden

[57] ABSTRACT

A communication system (100) encodes and decodes information utilizing at least four modulation levels for transmitting the information as symbols representing symbol bits in symbol bit positions. At least one of the symbol bit positions exhibits an error rate higher than that of another of the positions. A processor (204) encodes (702) the information into an even number of code words and transmits the code words as an interleaved data stream. The processor (204) rearranges (706, 708) the transmission order of the code word bits in a predetermined way to form a modified transmission order such that the code words are transmitted (710) with substantially equal error rates. A receiver (110) receives and demodulates (712) the interleaved data stream to derive the code word bits, and then reorders (714, 716) the code word bits to undo bit modifications resulting from the modified transmission order, thereby restoring the code words. The receiver then decodes the code words to recover the information.

19 Claims, 7 Drawing Sheets

FIG. 4
400
PRIOR ART

|   | 1 | 2 | 3 | 4 | 5 | 6 | 7 | 8 |
|---|---|---|---|---|---|---|---|---|
| 401 | 1 | 9 | 17 | 25 | 33 | 41 | 49 | 57 |
| 402 | 2 | 10 | 18 | 26 | 34 | 42 | 50 | 58 |
| 403 | 3 | 11 | 19 | 27 | 35 | 43 | 51 | 59 |
| 404 | 4 | 12 | 20 | 28 | 36 | 44 | 52 | 60 |
| 405 | 5 | 13 | 21 | 29 | 37 | 45 | 53 | 61 |
| 406 | 6 | 14 | 22 | 30 | 38 | 46 | 54 | 62 |
| 407 | 7 | 15 | 23 | 31 | 39 | 47 | 55 | 63 |
| 408 | 8 | 16 | 24 | 32 | 40 | 48 | 56 | 64 |

FIG. 5
500

|   | 0 | 1 | 0 | 1 | 0 | 1 | 0 | 1 |
|---|---|---|---|---|---|---|---|---|
| 501 | 1 | 10 | 17 | 26 | 33 | 42 | 49 | 58 |
| 502 | 2 | 9 | 18 | 25 | 34 | 41 | 50 | 57 |
| 503 | 3 | 12 | 19 | 28 | 35 | 44 | 51 | 60 |
| 504 | 4 | 11 | 20 | 27 | 36 | 43 | 52 | 59 |
| 505 | 5 | 14 | 21 | 30 | 37 | 46 | 53 | 62 |
| 506 | 6 | 13 | 22 | 29 | 38 | 45 | 54 | 61 |
| 507 | 7 | 16 | 23 | 32 | 39 | 48 | 55 | 64 |
| 508 | 8 | 15 | 24 | 31 | 40 | 47 | 56 | 63 |

FIG. 6
600

|   | 0 | 1 | 2 | 3 | 0 | 1 | 2 | 3 |
|---|---|---|---|---|---|---|---|---|
| 601 | 1 | 12 | 19 | 26 | 33 | 44 | 51 | 58 |
| 602 | 2 | 9 | 20 | 27 | 34 | 41 | 52 | 59 |
| 603 | 3 | 10 | 17 | 28 | 35 | 42 | 49 | 60 |
| 604 | 4 | 11 | 18 | 25 | 36 | 43 | 50 | 57 |
| 605 | 5 | 16 | 23 | 30 | 37 | 48 | 55 | 62 |
| 606 | 6 | 13 | 24 | 31 | 38 | 45 | 56 | 63 |
| 607 | 7 | 14 | 21 | 32 | 39 | 46 | 53 | 64 |
| 608 | 8 | 15 | 22 | 29 | 40 | 47 | 54 | 61 |

804

| 0 | 0 | 0 | 0 | 1 | 1 | 1 | 1 |
|---|---|---|---|---|---|---|---|
| 1 | 9 | 17 | 25 | 33 | 41 | 49 | 57 |
| 2 | 10 | 18 | 26 | 34 | 42 | 50 | 58 |
| 3 | 11 | 19 | 27 | 35 | 43 | 51 | 59 |
| 4 | 12 | 20 | 28 | 36 | 44 | 52 | 60 |
| 5 | 13 | 21 | 29 | 37 | 45 | 53 | 61 |
| 6 | 14 | 22 | 30 | 38 | 46 | 54 | 62 |
| 7 | 15 | 23 | 31 | 39 | 47 | 55 | 63 |
| 8 | 16 | 24 | 32 | 40 | 48 | 56 | 64 |

| 0 | 0 | 0 | 0 | 1 | 1 | 1 | 1 |
|---|---|---|---|---|---|---|---|
| 1 | 9 | 17 | 25 | 34 | 42 | 50 | 58 |
| 2 | 10 | 18 | 26 | 35 | 43 | 51 | 59 |
| 3 | 11 | 19 | 27 | 36 | 44 | 52 | 60 |
| 4 | 12 | 20 | 28 | 37 | 45 | 53 | 61 |
| 5 | 13 | 21 | 29 | 38 | 46 | 54 | 62 |
| 6 | 14 | 22 | 30 | 39 | 47 | 55 | 63 |
| 7 | 15 | 23 | 31 | 40 | 48 | 56 | 64 |
| 8 | 16 | 24 | 32 | 33 | 41 | 49 | 57 |

METHOD AND APPARATUS FOR ENCODING AND DECODING INFORMATION IN A DIGTIAL COMMUNICATION SYSTEM

FIELD OF THE INVENTION

This invention relates in general to digital communication systems, and more specifically to a method and apparatus for encoding and decoding information in a digital communication system.

BACKGROUND OF THE INVENTION

In digital radio communication systems, bit interleaving is commonly utilized to improve error rates in the presence of burst errors associated with simulcast and channel fading. Bit interleaving is a process of time division multiplexing the transmission of code words such that consecutive bits of each code word are not transmitted consecutively. Instead, consecutive bits of each code word are separated in time by a number of bits referred to as the interleaving depth.

A conventional interleaving method stores the bits of a plurality of code words in a memory handled as a rectangular array in which each code word forms a row of the array, while each column of the array corresponds to the bits in one bit position of all the code words. The interleaving is then easily accomplished by transmitting the bits of the array in a column-by-column manner, thereby achieving an interleaving depth equal to the number of code words in the array.

A problem can occur with the conventional interleaving method, however, in systems transmitting information utilizing $2^M$ symbols at $2^M$ modulation levels, in which each symbol represents M symbol bits. The problem occurs if M is an even number (e.g., four-level or sixteen-level modulation) and if the number of code words in the rectangular array is an integer multiple of M. If those two conditions are met, the conventional interleaving method will transmit each code word by repeatedly using a single symbol bit position. This is undesirable, because some "weak" symbol bit positions consistently have higher error rates than others. A code word transmitted by repeatedly using a "weak" symbol bit position will have a greater frequency of uncorrectable errors than a code word in which the "weak" symbol bit positions are interspersed among "strong" symbol bit positions.

While a trivial solution to the problem might appear to be simply to chose a rectangular array size comprising a number of code words that is not an integer multiple of M, this solution is undesirable for the following reason. Efficiency of processing the data in the rectangular array is an important consideration. To maintain efficiency of processing, both the code word length and the interleaving depth should be a multiple of eight bits (one byte). This requirement causes the number of code words to be an integer multiple of M when M=2, 4, 8, et cetera. Furthermore, the value of M is generally dictated by system requirements and cannot be easily changed.

Thus, what is needed is a method and apparatus for interleaving the transmission of code word bits that utilizes a rectangular array size consistent with efficiency of data processing, while preventing a single symbol bit position from being used exclusively for transmitting any of the code words. The method and apparatus preferably will provide an even distribution of the symbol bit positions for transmitting each code word.

SUMMARY OF THE INVENTION

An aspect of the present invention is a method for encoding and decoding information in a digital communication system utilizing at least four modulation levels for transmitting the information as symbols. Each symbol represents a plurality of symbol bits positioned in a plurality of symbol bit positions. At least one of the plurality of symbol bit positions exhibits an error rate higher than that of another of the plurality of symbol bit positions. The method comprises the steps of encoding the information into an even-numbered plurality of code words comprising a plurality of code word bits positioned in a plurality of code word bit positions, and transmitting the even-numbered plurality of code words as an interleaved data stream. A transmission order of the plurality of code word bits is rearranged in a predetermined way to form a modified transmission order such that the plurality of code [words are transmitted with substantially equal error rates] word bits corresponding to each of said plurality of code words are transmitted with substantially equal distribution in each of said plurality of symbol bit positions. The method further comprises the steps of receiving and demodulating the interleaved data stream to derive the plurality of code word bits, and reordering the plurality of code word bits after reception to undo bit modifications resulting from the modified transmission order, thereby restoring the plurality of code words. The method further comprises the step of decoding the plurality of code words after restoration to recover the information.

Another aspect of the present invention is a digital communication system for encoding and decoding information. The digital communication system utilizes at least four modulation levels for transmitting the information as symbols. Each symbol represents a plurality of symbol bits positioned in a plurality of symbol bit positions. At least one of the plurality of symbol bit positions exhibits an error rate higher than that of another of the plurality of symbol bit positions. The digital communication system comprises an encoder for encoding the information into an even-numbered plurality of code words comprising a plurality of code word bits positioned in a plurality of code word bit positions, and an interleaver coupled to the encoder for transmitting the even-numbered plurality of code words as an interleaved data stream. A transmission order of the plurality of code word bits is rearranged in a predetermined way to form a modified transmission order such that the plurality of code word bits corresponding to each of said plurality of code words are transmitted with substantially equal distribution in each of said plurality of symbol bit positions. The digital communication system further comprises a receiver coupled to the interleaver for receiving and demodulating the interleaved data stream to derive the plurality of code word bits, and a reorderer coupled to the receiver for reordering the plurality of code word bits after reception to undo bit modifications resulting from the modified transmission order, thereby restoring the plurality of code words. The digital communication system further comprises a decoder coupled to the reorderer for decoding the plurality of code words after restoration to recover the information.

Another aspect of the present invention is a controller for encoding information in a digital communication system utilizing at least four modulation levels for transmitting the information as symbols. Each symbol represents a plurality of symbol bits positioned in a plurality of symbol bit positions. At least one of the plurality of symbol bit positions exhibits an error rate higher than that of another of the plurality of symbol bit positions. The controller comprises an encoder for encoding the information into an even-numbered plurality of code words comprising a plurality of code word bits positioned in a plurality of code word bit positions, and an interleaver coupled to the encoder for transmitting the even-numbered plurality of code words as an interleaved data stream. A transmission order of the plurality of code word bits is rearranged in a predetermined way to form a modified transmission order such that the plurality of code [words are transmitted with substantially equal error rates] word bits corresponding to each of said plurality of code words are transmitted with substantially equal distribution in each of said plurality of symbol bit positions.

Yet another aspect of the present invention is a communication receiver for decoding information in a digital communication system utilizing at least four modulation levels for transmitting the information as symbols. Each symbol represents a plurality of symbol bits positioned in a plurality of symbol bit positions. At least one of the plurality of symbol bit positions exhibits an error rate higher than that of another of the plurality of symbol bit positions. The digital communication system comprises an encoder for encoding the information into an even-numbered plurality of code words comprising a plurality of code word bits positioned in a plurality of code word bit positions. The digital communication system further comprises an interleaver coupled to the encoder for transmitting the even-numbered plurality of code words as an interleaved data stream. A transmission order of the plurality of code word bits is rearranged in a predetermined way to form a modified transmission order such that the plurality of code [words are transmitted with substantially equal error rates] word bits corresponding to each of said plurality of code words are transmitted with substantially equal distribution in each of said plurality of symbol bit positions. The communication receiver comprises a receiver coupled to the interleaver for receiving and demodulating the interleaved data stream to derive the plurality of code word bits, and a reorderer coupled to the receiver for reordering the plurality of code word bits after reception to undo bit modifications resulting from the modified transmission order, thereby restoring the plurality of code words. The communication receiver further comprises a decoder coupled to the reorderer for decoding the plurality of code words after restoration to recover the information.

BRIEF DESCRIPTION OF THE DRAWINGS

FIG. 4 is a prior art interleaving diagram depicting a conventional bit interleaving method.

FIG. 5 is an interleaving diagram depicting a bit interleaving method for four-level modulation in accordance with the preferred embodiment of the present invention.

FIG. 6 is an interleaving diagram depicting a bit interleaving method for sixteen-level modulation in accordance with the preferred embodiment of the present invention.

FIG. 8 is an interleaving diagram for four-level modulation depicting a bit interleaving method in accordance with an alternative embodiment of the present invention prior to bit shifting.

FIG. 9 is an interleaving diagram for four-level modulation depicting the bit interleaving method in accordance with the alternative embodiment of the present invention after bit shifting.

FIG. 10 is an interleaving diagram for sixteen-level modulation depicting the bit interleaving method in accordance with the alternative embodiment of the present invention prior to bit shifting.

FIG. 11 is an interleaving diagram for sixteen-level modulation depicting the bit interleaving method in accordance with the alternative embodiment of the present invention after bit shifting.

DESCRIPTION OF THE PREFERRED EMBODIMENT

Figure 1:
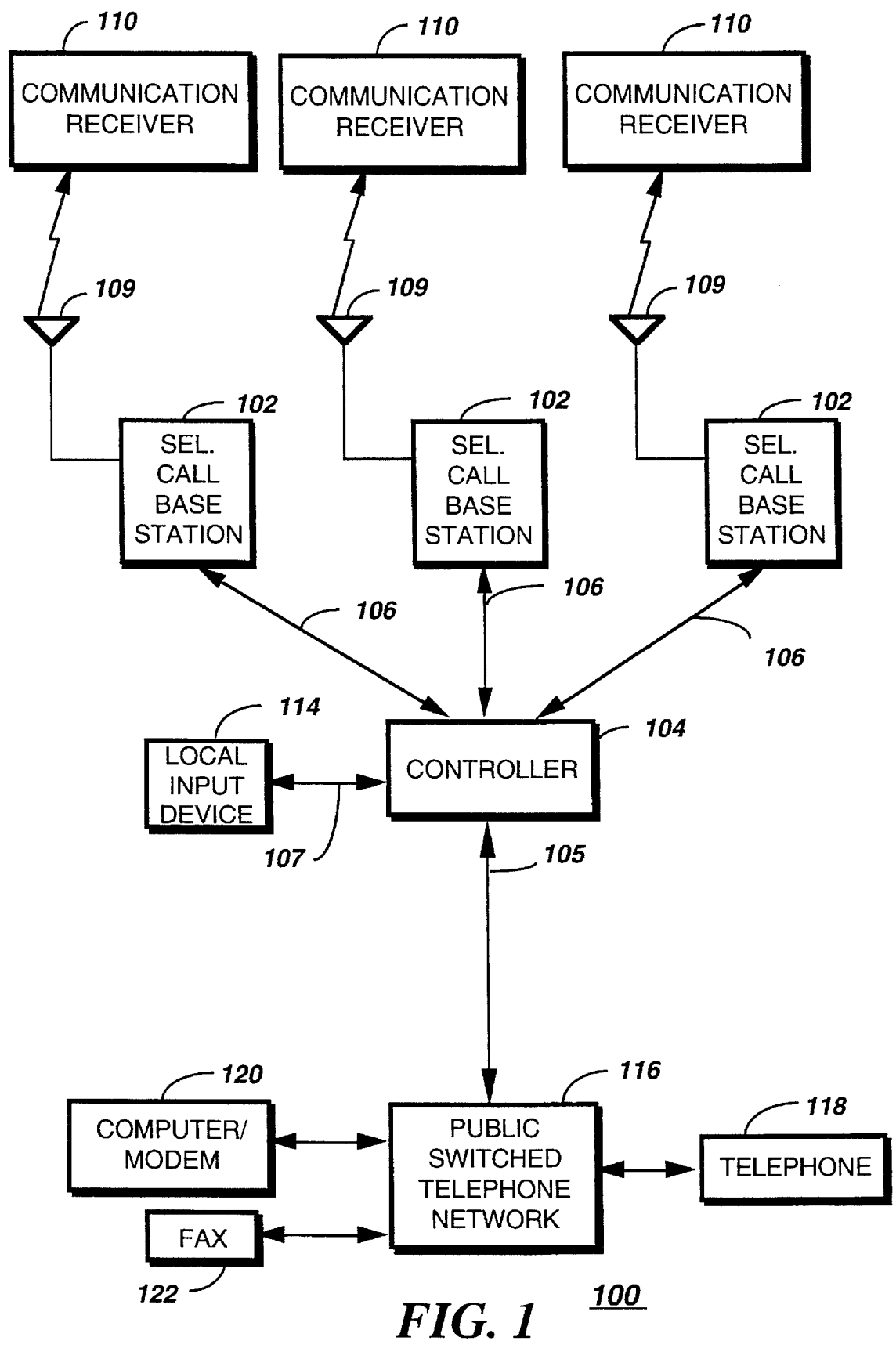
FIG. 1 is an electrical block diagram of a digital radio communication system in accordance with the preferred embodiment of the present invention.

With reference to FIG. 1, an electrical block diagram of a digital communication system 100 in accordance with the preferred embodiment of the present invention comprises a plurality of conventional selective call base stations 102 coupled by communication links 106 to a controller 104 for controlling the selective call base stations 102. Each of the selective call base stations 102 transmits radio signals to a plurality of communication receivers 110 via a transmitting antenna 109. The radio signals comprise selective call addresses and messages transmitted to the communication receivers 110. The controller 104 is coupled by a conventional local link 107 to a local input device 114, e.g., a conventional keyboard/display terminal, for accepting selective call originations and coupled by a conventional remote link 105 to the public switched telephone network (PSTN) 116. Selective call originations from the PSTN 116 can be generated, for example, from a conventional telephone 118, a conventional computer/modem 120, or a conventional facsimile machine 122 coupled to the PSTN 116 in a manner well known in the art.

Transmissions between the selective call base stations 102 and the communication receivers 110 preferably utilize a well-known selective calling signaling protocol, such as the Motorola FLEX™ protocol. It will be appreciated that other protocols such as the Golay Sequential Code (GSC) or Post Office Code Standardization Advisory Group (POCSAG) protocol can be utilized as well. These protocols utilize well-known error detection and error correction techniques and are therefore tolerant to bit errors occurring during transmission, provided that the bit errors are not too numerous in any one code word. FLEX™, for example, utilizes a 32/21 Bose-Chadhuri-Hocquenghem (BCH) code word comprising 21 information bits and 11 parity bits. This code word can be processed in a well-known manner to correct up to two bit errors occurring within the code word.

Transmissions from the selective call base stations 102 preferably utilize four-level frequency shift keyed (FSK) modulation, operating in the range of sixteen-hundred to thirty-two-hundred symbols-per-second (sps) depending on traffic requirements. It will be appreciated that other signaling protocols, modulation schemes, and transmission rates can be utilized as well. Preferably, the selective call base stations 102 are similar to a model C73 PURC 5000® transmitter, the hardware of the controller 104 is similar to that of the MPS 2000™ paging control center, and the hardware of the communication receiver 110 is similar to that of a model A03KLB5962CA ADVISOR® pager, all manufactured by Motorola, Inc. of Schaumburg, Ill. It will be appreciated that other similar hardware may be used as well to construct the digital communication system 100.

To facilitate a generic description of various embodiments in accordance with the present invention, it is hereby defined that the digital communication system utilizes $2^M$ modulation levels corresponding to $2^M$ symbols, and that each symbol represents M symbol bits in M symbol bit positions. Preferably, M is a positive integer greater than unity. For example, in a four-level system M=2. Each symbol transmitted thus would represent two bits of information. In a sixteen-level system M=4. Each symbol transmitted thus would represent four bits of information. Preferably, Grey encoding is utilized, wherein adjacent symbols differ by a single bit. For example, in a four level system having symbols A, B, C, and D in ascending order of modulation frequency, the symbols can represent the bit combinations 00, 01, 11, and 10, respectively. In such a system a code word 0111001011101101 (visualize as 01-11-00-10-11-10-11-01) can be transmitted as the symbols B-C-A-D-C-D-C-B.

Figure 2:
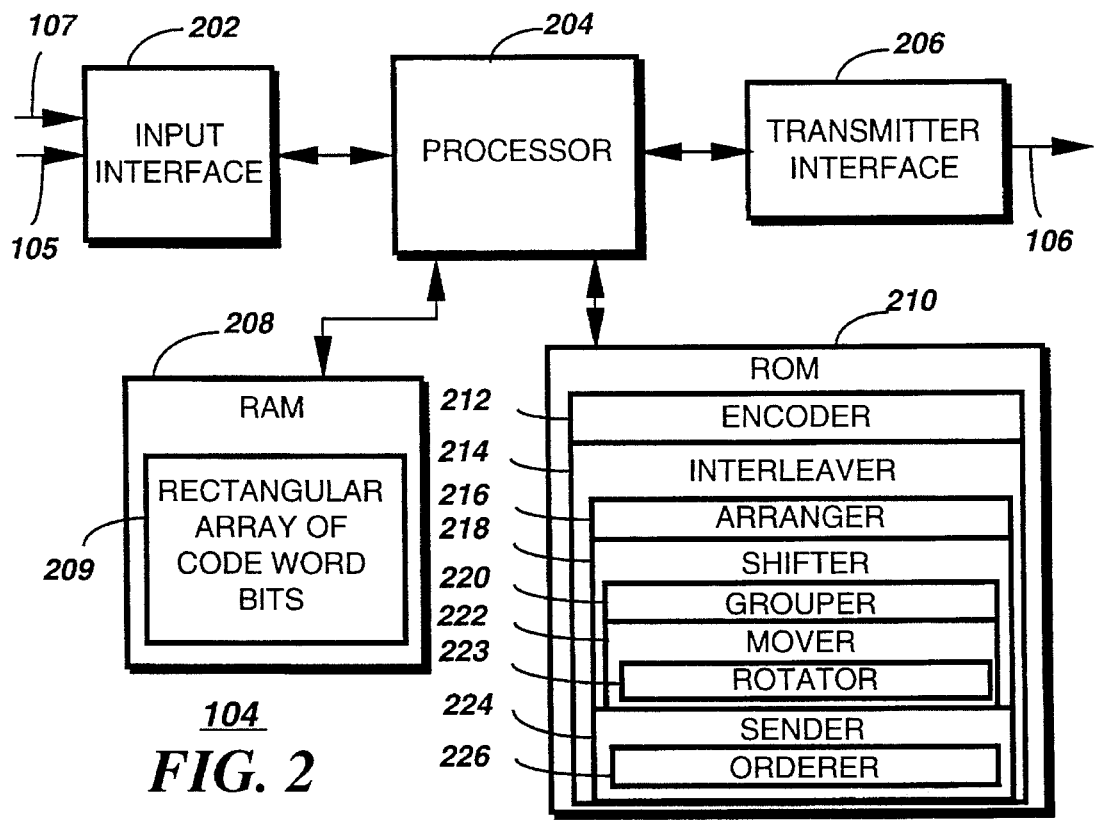
FIG. 2 is an electrical block diagram of a controller in accordance with the preferred and alternative embodiments of the present invention.

With reference to FIG. 2, an electrical block diagram of the controller 104 in accordance with the preferred and alternative embodiments of the present invention comprises an input interface 202 coupled to the local and remote links 107, 105 for receiving selective call originations therefrom. The input interface 202 is also coupled to a processor 204 for controlling the operation of the controller 104. The processor 204 is coupled to a transmitter interface for controlling the plurality of selective call base stations 102 and for sending selective call signals thereto through the communication links 106. The processor 204 is also coupled to a random access memory (RAM) 208 for temporary storage of operating variables, such as a rectangular array of code word bits 209. In addition, the processor 204 is coupled to a read-only memory (ROM) 210 comprising firmware elements in accordance with the preferred embodiment of the present invention.

The firmware elements include an encoder 212 for encoding information to be transmitted to ones of the plurality of communication receivers 110 into an even-numbered plurality of code words comprising a plurality of code word bits positioned in a plurality of code word bit positions. More specifically, to increase processing efficiency the encoder preferably encodes a number of code words, the number being a multiple of the quantity of bits in one byte, e.g., 8, 16, 24, 32, et cetera.

The firmware elements also include an interleaver 214 for transmitting the even-numbered plurality of code words as an interleaved data stream. The transmission order of the plurality of code word bits is rearranged in a predetermined way to form a modified transmission order such that the plurality of code word bits corresponding to each of the plurality of code words are transmitted with substantially equal error rates. This preferably is accomplished by forming the modified transmission order such that the plurality of code word bits corresponding to each of the plurality of code words are transmitted with substantially equal distribution in each of a plurality of symbol bit positions. Here, the word "substantially" means "to the extent possible." For example, if the length of the code words is even, e.g., 32 bits, and there are two symbol bits in two symbol bit positions per symbol, then it is possible to transmit half the code word bits of each of the code words in each of the two symbol bit positions, thereby transmitting the code word bits of each of the code words with exactly equal distribution in each of the two symbol bit positions. On the other hand, if the length of the code words is odd, e.g., 33 bits, and there are two symbol bits in two symbol bit positions per symbol, then it is impossible to send half the code word bits of each of the code words in each of the two symbol bit positions. Thus the code word bits of a code word of odd length cannot be transmitted with exactly equal distribution in each of the two symbol bit positions, but only substantially equal distribution, e.g., 16 code word bits in one symbol bit position and 17 code word bits in the other symbol bit position.

The interleaver 214 comprises an arranger 216 for arranging the plurality of code words into a rectangular array of rows and columns, wherein each of the plurality of code words forms one of the rows of the rectangular array, and wherein the plurality of code word bits form the columns of the rectangular array, each column corresponding to one of a plurality of code word bit positions. The interleaver 214 also includes a shifter 218 for shifting, in a predetermined manner, the plurality of code word bits within portions of the columns to new positions in order to rearrange the plurality of code word bits. In addition, the interleaver 214 includes a sender 224 for sending the plurality of code word bits, as rearranged, in column-by-column order, wherein within a transmission of a column the plurality of code word bits of the column are transmitted in a linear row-by-row order.

The shifter 218 comprises a grouper 220 for grouping the plurality of code word bits into M types of groups, each of the M types of groups identified by a type integer ranging from 0 through M-1, each group consisting of a portion of the plurality of code word bits that are transmitted in a single symbol. The distribution of the M types of groups is such that each of the plurality of code words has a substantially equal number of the plurality of code word bits from each of the M types of groups. As before, "substantially" means "to the extent possible." The shifter 218 further comprises a mover 222 for moving, in a circular manner within each group, the portion of the plurality of code word bits in the group by a number of bit positions, wherein the number of bit positions is equal to the type integer of the group.

In an alternative embodiment in accordance with the present invention, the grouper 220 is for grouping the plurality of code word bits into M types of groups, each of the M types of groups identified by a. type integer ranging from 0 through M-1, each group consisting of a columnar portion of the plurality of code word bits that comprises an integer multiple of eight bits. The distribution of the M types of groups is such that each of the plurality of code words has a substantially equal number of the plurality of code word bits from each of the M types of groups. As explained herein above, the advantage of allowing each group to comprise an integer multiple of eight bits is that eight bits is the number of bits in one byte. Processors can handle data efficiently if the data is organized into byte-sized groups.

In the alternative embodiment the sender 224 comprises an orderer 226 for sending the plurality of code word bits of the columns identified by a lower type integer before sending the plurality of code word bits of the columns identified by a higher type integer. Also in the alternative embodiment the mover 222 comprises a rotator 223 for moving the portion of the plurality of code word bits upward within each column identified by a type integer greater than zero, except for the N uppermost bits of each column, the N uppermost bits being rotated to a lowermost position in the column, thereby filling the voids created by the upward shift of the other bits.

As also stated herein above, the hardware of the controller 104 is similar to that of the MPS 2000™ paging control center. It will be appreciated that other types of memory, e.g., magnetic disk memory, optical memory, electrically erasable programmable random access memory (EEPROM), can be substituted as well for the RAM 208 and the ROM 210.

Figure 3:
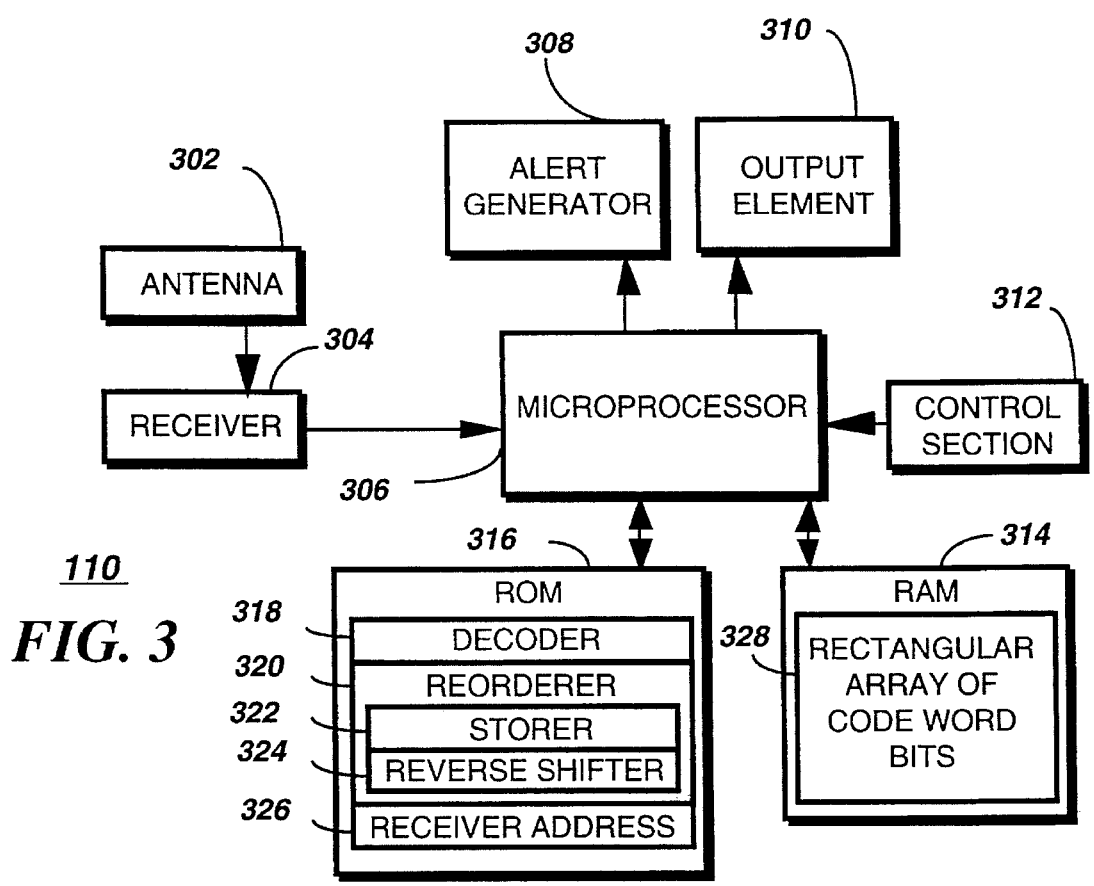
FIG. 3 is an electrical block diagram of a communication receiver in accordance with the preferred embodiment of the present invention.

With reference to FIG. 3, an electrical block diagram of the communication receiver 110 in accordance with the preferred embodiment of the present invention comprises an antenna 302 for intercepting messages transmitted from the selective call base stations 102 as an interleaved data stream. The antenna 302 is coupled to a receiver 304 for receiving and demodulating the interleaved data stream to derive the plurality of code word bits contained therein. The receiver 304 is coupled to a microprocessor 306 for decoding and processing information carried in the radio signals. The microprocessor 306 is coupled to a conventional random access memory (RAM) 314, for storing the code words received. The code words are stored as a rectangular array of code word bits 328. The microprocessor 306 is also coupled to an output element 310, such as a conventional liquid crystal display (LCD) or a loudspeaker, for visibly or audibly outputting the messages received.

The microprocessor 306 is further coupled to a control section 312, comprising well-known switches and buttons, for allowing a user to control the communication receiver 110. In addition, the microprocessor 306 is coupled to an alert generator 308, e.g., a conventional piezoelectric transducer (PZT) or lamp for generating an audible or visible alert in response to receiving information intended for the communication receiver 110. In addition, the microprocessor 306 is coupled to a read-only memory (ROM) 316 containing firmware elements for controlling the operation of the communication receiver 110 in accordance with the embodiments of the present invention.

The firmware elements include a decoder 318 for decoding the plurality of code words after restoration to recover the information. The firmware elements also include a reorderer 320 for reordering the plurality of code word bits after reception to undo bit modifications resulting from the modified transmission order, thereby restoring the plurality of code words. The reorderer 320 comprises a storer 322 for storing the interleaved data stream after reception in a manner that reconstructs the rectangular array comprising the plurality of code word bits as rearranged during transmission. The reorderer 320 further comprises a reverse shifter 324 for shifting, in a manner that is the reverse of the predetermined manner used by the shifter 218, the plurality of code word bits within the portion of the columns to restore the original bit positions, thereby restoring the plurality of code words. The firmware elements also include a receiver selective call address 326 for selectively identifying the communication receiver 110.

It will be appreciated that other types of non-volatile memory, e.g., EEPROM, battery-backed-up RAM, programmable read-only memory (PROM), etc., can be substituted for the ROM 316. It will be further appreciated that the microprocessor 306, the RAM 314, and the ROM 316 can be combined in whole or in part as a contiguous integrated circuit device.

With reference to FIG. 4, a prior art interleaving diagram 400 depicts a conventional bit interleaving method in which, for illustrative purposes, the code word bits have been assembled into an eight-by-eight rectangular array. The rows of the rectangular array each contain an eight-bit code word 401–408. The columns 410 of the rectangular array each contain a code word bit from each of the code words 401–408, the code word bits corresponding to a constant bit position. The columns are numbered by column numbers 418 from 1–8. The heavy horizontal lines 420 indicate symbol boundaries, each symbol representing two symbol bits of information (M=2) corresponding to two code word bits.

The prior art interleaving diagram 400 utilizes the numbers 1–64 to identify the code word bits. As the bits are transmitted column-by-column, the numbers also represent the order in which the code word bits are transmitted in the conventional bit interleaving method. Note that the code word bits are transmitted in a linear row-by-row order within each column. For example, the code word bits of the code word 401 are, transmitted in 1st, 9th, 17th, 25th, 33rd, 41st, 49th, and 57th transmission positions. By interleaving the code word bits in the manner shown, the code word error rate is improved in the presence of burst errors associated with channel fading.

It will be appreciated that a rectangular array of another size can be utilized as well, the size being determined by the code word bit length and by the interleaving depth required for adequate time separation of the code word bits during transmission. For example, an array of thirty-two by thirty-two bits is preferred for Motorola's FLEX™ protocol when operating at 6400 bits per second. This provides an interval of five milliseconds between adjacent code word bits belonging to a single code word, an interval deemed to provide substantial improvement in burst error protection.

As explained earlier, a problem can occur with the conventional interleaving method in systems transmitting information utilizing $2^M$ symbols at $2^M$ modulation levels, in which each symbol represents M symbol bits. The problem occurs if M is an even number (e.g., four-level or sixteen-level modulation) and if the number of code words 401–408 in the rectangular array is an integer multiple of M. If those two conditions are met, the conventional interleaving method will transmit each code word 401–408 by repeatedly using the same symbol bit position. This is undesirable, because some "weak" symbol bit positions consistently have higher error rates than others. A code word 401–408 transmitted by repeatedly using a "weak" symbol bit position will have a greater frequency of uncorrectable errors than a code word in which the "weak" symbol bit positions are interspersed among "strong" symbol bit positions.

Note, for example, that the code word bits of the code word 401 are all transmitted in odd numbered transmission positions, while the code word bits of the code word 402 are all transmitted in even numbered transmission positions. In a system utilizing four-level modulation (two bits per symbol), the code word bits of the code word 401 will each be transmitted by the first symbol bit, while the code word bits of the code word 402 will each be transmitted by the second symbol bit. The same phenomenon occurs for the remainder of the code words. Each is transmitted in all-odd or all-even symbol bit positions. This is undesirable, because half of the code words 401–408 will be transmitted in the "weak" symbol bit position and will thus be more likely to contain too many bit errors for the error correcting code to correct.

With reference to FIG. 5, an interleaving diagram 500 depicts a bit interleaving method for four-level modulation in accordance with the preferred embodiment of the present invention. As in the prior art interleaving diagram 400, the code word bits are first assembled into a rectangular array. The rows each contain a code word 501–508, while the columns 510, 512 each contain one code word bit from all the code words 501–508 in common bit positions. In accordance with the preferred embodiment of the present invention, the code word bits have been grouped into two types of groups, and, preferably, each column contains only one of the two types of groups. The type of group in each column is identified by a type integer 518 ranging from 0 to 1. The heavy horizontal lines 520 indicate symbol boundaries, each symbol representing two symbol bits of information corresponding to two code word bits (M=2). It will be appreciated that, in the alternative, columns can contain more than a single type of group, the preferred requirement being that each of the code words 501–508 should contain a substantially equal number of bits from each of the two types of groups. Clearly, this requirement is satisfied by the interleaving diagram 500, in which each of the code words 501–508 contains 4 bits from each type of group.

In accordance with the preferred embodiment of the present invention, the code word bits are grouped within each column into groups consisting of code word bits that will be transmitted in a single symbol. For example, code word bits 1 and 2 form a group; bits 3 and 4 form a group; bits 5 and 6 form a group, and so on. The numbers 1–64 within the cells of the rectangular array represent the same bits as the numbers 1–64 in the prior art interleaving diagram 400. Note that the transmission positions of the numbers 1–64 in the groups having a type integer equal to 1 differ from those of the prior art interleaving diagram 400.

The transmission positions of code word bits of the groups having a type integer equal to 1 preferably are swapped with one another. For example, in the second column 512 the transmission positions of bits 9 and 10 have been swapped. This means that the bit that conventionally would have been transmitted in the 10th transmission position, is transmitted in the 9th position, while the bit that conventionally would have been transmitted in the 9th transmission position, is transmitted in the 10th transmission position. After the code word bits have been received by the communication receiver 110, they are assembled into a similar rectangular array, and the code word bits that were swapped previously are swapped back to their original positions to restore the original code words. (After being swapped back to their original positions, the code word bits will be positioned in the rectangular array as depicted in the prior art interleaving diagram 400, so that the code words can be decoded in a conventional manner.) The result is that each of the restored code words consists of an equal number of code word bits transmitted in the even and odd numbered transmission positions. Thus each code word advantageously consists of equal numbers of "strong" and "weak" symbol bits, thereby reducing the probability of any single code word having more than two errors, and thus improving the overall word error rate.

It will be appreciated that the swapping of the transmission positions alternatively can be accomplished by leaving the code word bits undisturbed in their original positions in the rectangular array and altering the order by which the code word bits are transmitted from the rectangular array. The precise way that the swapping of the transmission positions within each of the groups is accomplished is not important, as long as the transmission positions are modified such that each of the received code words consists of a substantially equal number of code word bits transmitted in each of the symbol bit positions. It will be further appreciated there are many different ways in which the transmission positions can be swapped. For example, the first four columns can be transmitted unswapped, while the last four columns are transmitted swapped. Any swapping method that equalizes the number of odd and even symbol bit positions utilized to transmit each of the code words will perform in accordance with the preferred embodiment of the present invention, provided that the bits that would have been transmitted in a given symbol are not moved to a different symbol.

With reference to FIG. 6, an interleaving diagram 600 depicts a bit interleaving method for sixteen-level modulation in accordance with the preferred embodiment of the present invention. As in the interleaving diagram 500, the code word bits are first assembled into a rectangular array. The rows each contain a code word 601–608, while the columns 610, 612, 614, and 616 each contain one code word bit from all the code words 601–608 in a common bit position. In accordance with the preferred embodiment of the present invention, the code word bits have been grouped into four types of groups, and, preferably, each column 610–616 contains only one of the four types of groups. The type of group in each column 610–616 is identified by a type integer 618 ranging from 0 to 3. The heavy horizontal lines 620 indicate symbol boundaries, each symbol representing four symbol bits of information corresponding to four code word bits (M=4). It will be appreciated that, in the alternative, the columns 610–616 can contain more than a single type of group, the preferred requirement being that each of the code words 601–608 should contain a substantially equal number of bits from each of the four types of groups. Clearly, this requirement is satisfied by the interleaving diagram 600, in which each of the code words 601–608 contains two bits from each type of group.

In accordance with the preferred embodiment of the present invention, the code word bits are grouped within each column into groups consisting of code word bits that will be transmitted in a single symbol. For example, code word bits 1, 2, 3, and 4 form a group; bits 5, 6, 7, and 8 form a group; bits 9, 10, 11, and 12 form a group, and so on. The numbers 1–64 within the cells of the rectangular array represent the same bits as the numbers 1–64 in the prior art interleaving diagram 400. Note that the transmission positions of the numbers 1–64 in the groups having a type integer greater than zero differ from those of the prior art interleaving diagram 400. The code word bits in the groups having a type integer greater than zero are vertically shifted in a circular manner by a number of bit positions equal to the type integer. Preferably, the direction of the vertical shift (upward or downward) is constant for all the groups. The circular manner is such that after the shift, the overflow bit is moved to the void in each group created by the shift. For example, in the second column 612, bits 9, 10, and 11 are shifted downward to the 10th, 11th, and 12th transmission positions, while the overflow bit 12 is moved into the void in the 9th transmission position.

A generic way of describing the shifting is that the code word bits are grouped into M types of groups, each of the M types of groups identified by a type integer ranging from 0 through M-1. Each group consists of a portion of the code word bits that are transmitted in a single symbol, and the groups are distributed such that each of the code words has a substantially equal number of bits from each of the M types of groups. After grouping, the code word bits of each group are moved, in a circular manner within each group, by a number of bit positions. The number of bit positions is equal to the type integer of the group.

By rotating the code word bits through each of the symbol bit positions as described above, the code word bits corresponding to each of the code words advantageously are transmitted with equal distribution in each of the M symbol bit positions, thereby preventing a "weak" symbol bit position from being continually used for any one code word. Also advantageously, the symbol interleave depth is unchanged by the interleaving method in accordance with the preferred embodiment of the present invention, because the code word bits are not rotated from one symbol to the next.

Figure 7:
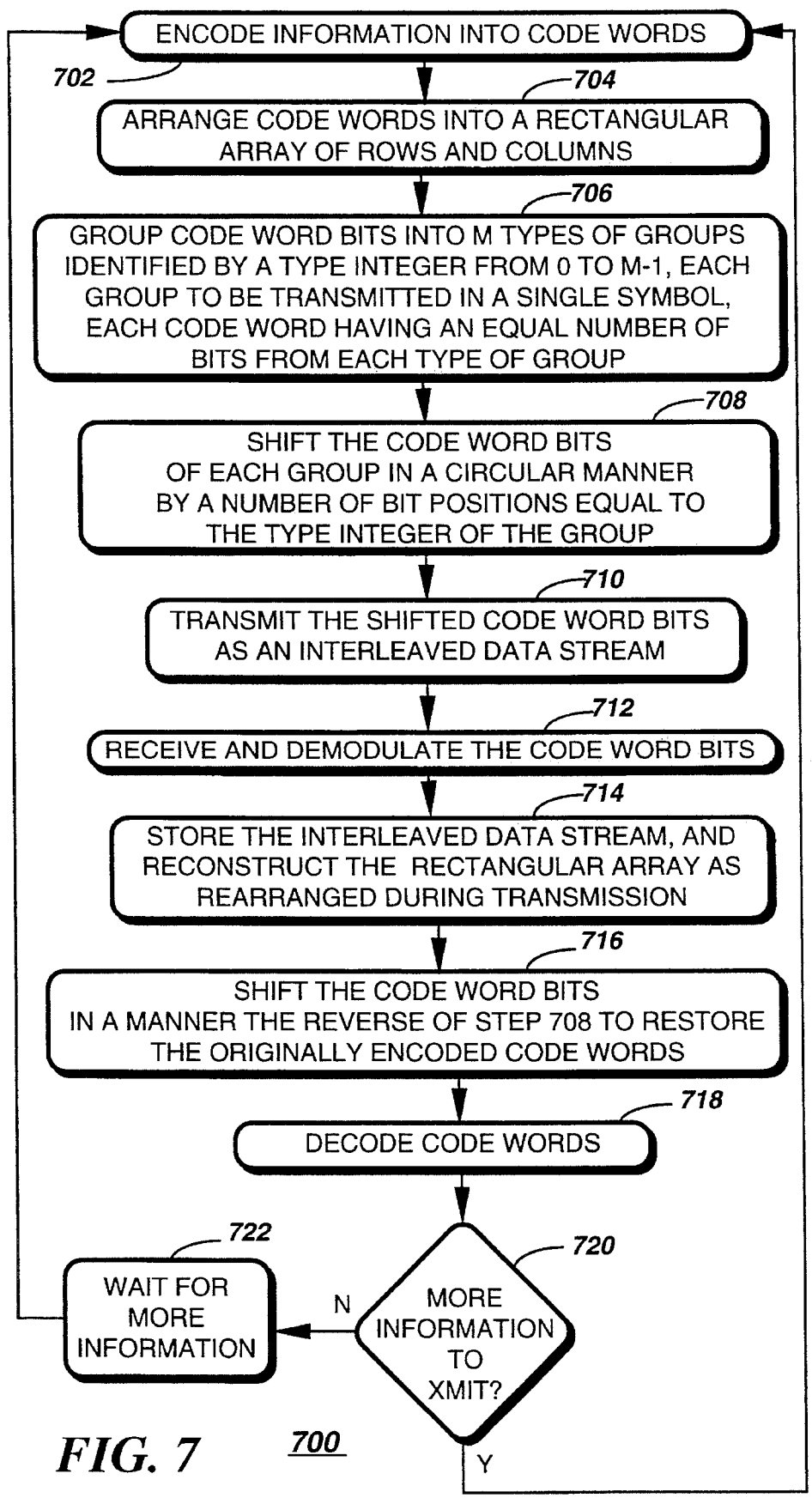
FIG. 7 is a flow chart depicting a method of encoding and decoding information in accordance with the preferred embodiment of the present invention.

With reference to FIG. 7, a flow chart 700 depicts a method of encoding and decoding information in accordance with the preferred embodiment of the present invention. The flow chart 700 begins with the processor 204 of the controller 104 accessing the encoder 212 to encode 702 the information into code words. Then the processor 204 accesses the RAM 208 and the arranger 216 to arrange 704 the code words as a rectangular array of code word bits. Next the processor 204 accesses the grouper 220 and groups 706 the code word bits into M types of groups identified by a type integer from 0 to M-1. Each of the groups are to be transmitted in a single symbol. The groups are distributed such that each code word has an equal number of bits from each type of group. The processor 204 then accesses the mover 222 to vertically shift 708 the code word bits of each group in a circular manner by a number of bit positions equal to the type integer of the group. The processor 204 then accesses the sender 224 and the transmitter interface 206 to transmit 710 the shifted code word bits as an interleaved data stream.

The receiver 304 of the communication receiver 110 receives and demodulates 712 the code word bits of the interleaved data stream. The microprocessor 306 accesses the storer 322 to store 714 the code word bits recovered from the data stream and to reconstruct the rectangular array as rearranged for transmission. Then the microprocessor 306 accesses the reverse shifter 324 to vertically shift 716 the code word bits in a manner the reverse of the step 708 to restore the code words as originally encoded in the step 702. The microprocessor 306 then accesses the decoder 318 to decode 718 the code words. In step 720 the processor 204 checks whether there is more information to transmit. If so, flow returns to step 702. If not, the processor 204 waits 722 for more information, and when more information arrives, flow returns to step 702.

The bit rearranging portions of the method of encoding and decoding information in accordance with the preferred embodiment of the present invention have been described above as being performed by the processor 204 and the microprocessor 306 under firmware control. It will be appreciated by one of ordinary skill in the art that, if desired, the bit rearranging portions of the method can be performed entirely in dedicated hardware. System requirements such as data transmission rate can cause dedicated hardware implementation of the bit rearranging portions to be preferable in order to reduce processing loads on the processor 204 and the microprocessor 306.

With reference to FIG. 8, an interleaving diagram 800 for four-level modulation depicting a bit interleaving method in accordance with an alternative embodiment of the present invention prior to bit shifting shows the code word bits 1-64 arranged into a rectangular array 802. As in the interleaving diagrams 400, 500, 600, the horizontal rows of the rectangular array 802 each contain an eight-bit code word. The vertical columns of the rectangular array 802 each contain a code word bit from each of the code words, the code word bits corresponding to a constant bit position. For enhanced processing efficiency, the code word bits have been grouped into eight columnar groups of eight bits each, and the groups are identified by eight type integers 804 ranging from 0 to 1. The code word bits of the groups having the type integer 804 equal to 0 will not be shifted. The code word bits of the groups having the type integer 804 equal to 1 will be shifted in a circular manner by one bit position. That is, each column having the type integer 804 equal to 1 preferably will be shifted upward by one bit position, and the overflow bits 33, 41, 49, and 57 will be moved to the bottoms of the columns as indicated by the arrows.

With reference to FIG. 9, an interleaving diagram 900 for four-level modulation depicting the bit interleaving method in accordance with the alternative embodiment of the present invention after bit shifting, shows the code word bits as shifted for transmission. Symbol boundaries are indicated by the heavy lines 902. The code word bits will be transmitted in column-by-column order as positioned in the interleaving diagram 900. That is, the bits will be transmitted in the following bit order: 1, 2, 3, 4, 5, 6, 7, 8, 9, 10, 11, and so on, through 63, 64, and 57. After transmission and receipt, the code word bits will be restored by the communication receiver 110 to their original positions as depicted in the interleaving diagram 800. Advantageously, most of the code word bits of each code word retain a full four-symbol interleave depth. Only three pairs of bits on either side of the discontinuity between the four groups having a type integer of 0 and the four groups having a type integer of 1 experience a reduction in symbol interleave depth. The affected bit pairs are 27/35 of the third original code word, 29/37 of the fifth original code word, and 31/39 of the seventh original code word, which experience a reduction of one symbol in interleave depth. This is believed to be of minor consequence to burst error protection, especially in larger arrays, e.g., 32×32 bit arrays.

If desired for certain applications, an alternative shifting method can be utilized which causes three bit pairs to experience an increase in symbol depth, while a single bit pair experiences a larger reduction in symbol depth. This can be accomplished by shifting downward the code word bits of the groups having the type integer 804 of 1, and moving the bottom overflow bits in a direction opposite that shown by the arrows of the interleaving diagram 800. This will cause the bit pair 32/40 of the eighth original code word to be transmitted in adjacent symbols (symbol depth=1), while the symbol depth of all other bit pairs of the array remains either unchanged or increases by one symbol.

It will be appreciated that the type integers can be assigned in many different orders, and the code word bits rearranged in many different ways in accordance with the present invention, the preferred requirement being that, after rearrangement, each code word has a substantially equal number of bits from each type of group, and provided that symbol interleave is not adversely affected to an unacceptable degree. It is also preferable for a majority of applications and particularly for large arrays, e.g., 32×32 arrays, that the groups be shifted upward and that lower numbered group types be transmitted before higher numbered group types, in order prevent an excessive decrease in symbol interleave for at least one bit combination. For example, if the type 2 groups depicted in the interleaving diagram 900 were transmitted prior to the type 1 groups, then two bits of the first code word, e.g., bit 1 and bit 57, undesirably would be transmitted by immediately adjacent symbols.

Figures 10, 11:
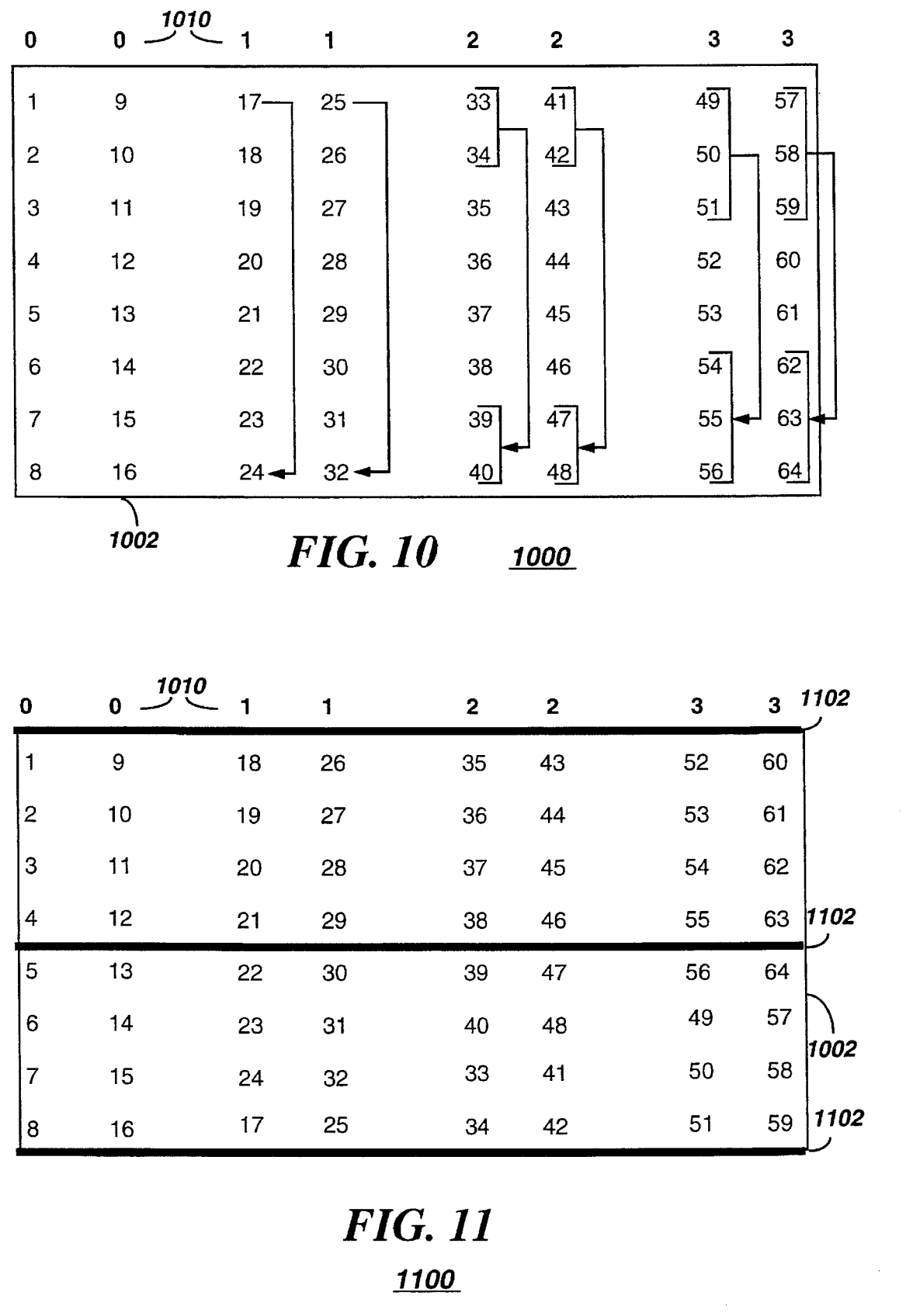

With reference to FIG. 10, an interleaving diagram 1000 for sixteen-level modulation depicting the bit interleaving method in accordance with the alternative embodiment of the present invention prior to bit shifting shows the code word bits 1-64 arranged into a rectangular array 1002. As in the interleaving diagrams 400, 500, 600, 800, 900, the horizontal rows of the rectangular array 1002 each contain an eight-bit code word. The vertical columns of the rectangular array 1002 each contain a code word bit from each of the code words, the code word bits corresponding to a constant bit position. For enhanced processing efficiency, the code word bits have been grouped into eight columnar groups of eight bits each, and the groups are identified by eight type integers 1010 ranging from 0 to 3. The code word bits of the groups having the type integer 1010 of 0 will not be shifted. The code word bits of the groups having the type integer 804 equal to 1 will be shifted in a circular manner by one bit position. That is, each column having the type integer 1010 of 1 preferably will be shifted upward by one bit position, and the overflow bits 17 and 25 will be moved to the bottoms of their respective columns as indicated by the arrows. In a similar manner, each column having the type integer 1010 equal to 2 preferably will be shifted upward by two bit positions, and the overflow bits 33, 34 and 41, 42 will be moved to the bottoms of their respective columns as indicated by the arrows. Similarly, each column having the type integer 1010 equal to 3 preferably will be shifted upward by three bit positions, and the overflow bits 49, 50, 51 and 57, 58, 59 will be moved to the bottoms of their respective columns as indicated by the arrows.

With reference to FIG. 11, an interleaving diagram 1100 for sixteen-level modulation depicting the bit interleaving method in accordance with the alternative embodiment of the present invention after bit shifting shows the code word bits as shifted for transmission. Symbol boundaries are indicated by the heavy lines 1102. The code word bits will be transmitted in column-by-column order as positioned in the interleaving diagram 1100. That is, the bits will be transmitted in the following bit order: 1, 2, 3, 4, 5, 6, 7, 8, 9, 10, 11, and so on, through 63, 64, 57, 58, and 59. After transmission and receipt, the code word bits will be restored by the communication receiver 110 to their original positions as depicted in the interleaving diagram 1000. Advantageously, most of the code word bits of each code word retain a full interleave depth. Only three pairs of bits on either side of the discontinuities between the groups having different valued type integers experience a reduction in symbol interleave depth. The affected bit pairs are 13/21 of the fifth original code word, 30/38 of the sixth original code word, and 47/55 of the seventh original code word, which experience a reduction of one symbol in interleave depth. In large arrays, e.g., 32×32 bit arrays, this is believed to be of minor consequence to burst error protection, but may need to be taken into consideration in small arrays, such as an 8×8 array, in which the symbol interleave is halved for the affected bits.

As stated herein above, it will be appreciated that the type integers can be assigned in many different orders, and the code word bits rearranged in many different ways in accordance with the present invention, the preferred requirement being that, after rearrangement, each code word has a substantially equal number of bits from each type of group, and provided that symbol interleave is not adversely affected to an unacceptable degree. It is also preferable for a majority of applications and particularly for large arrays, e.g., 32×32 arrays, that the groups be shifted upward and that lower numbered group types be transmitted before higher numbered group types, in order prevent an excessive decrease in symbol interleave for at least one bit combination.

Figure 12:
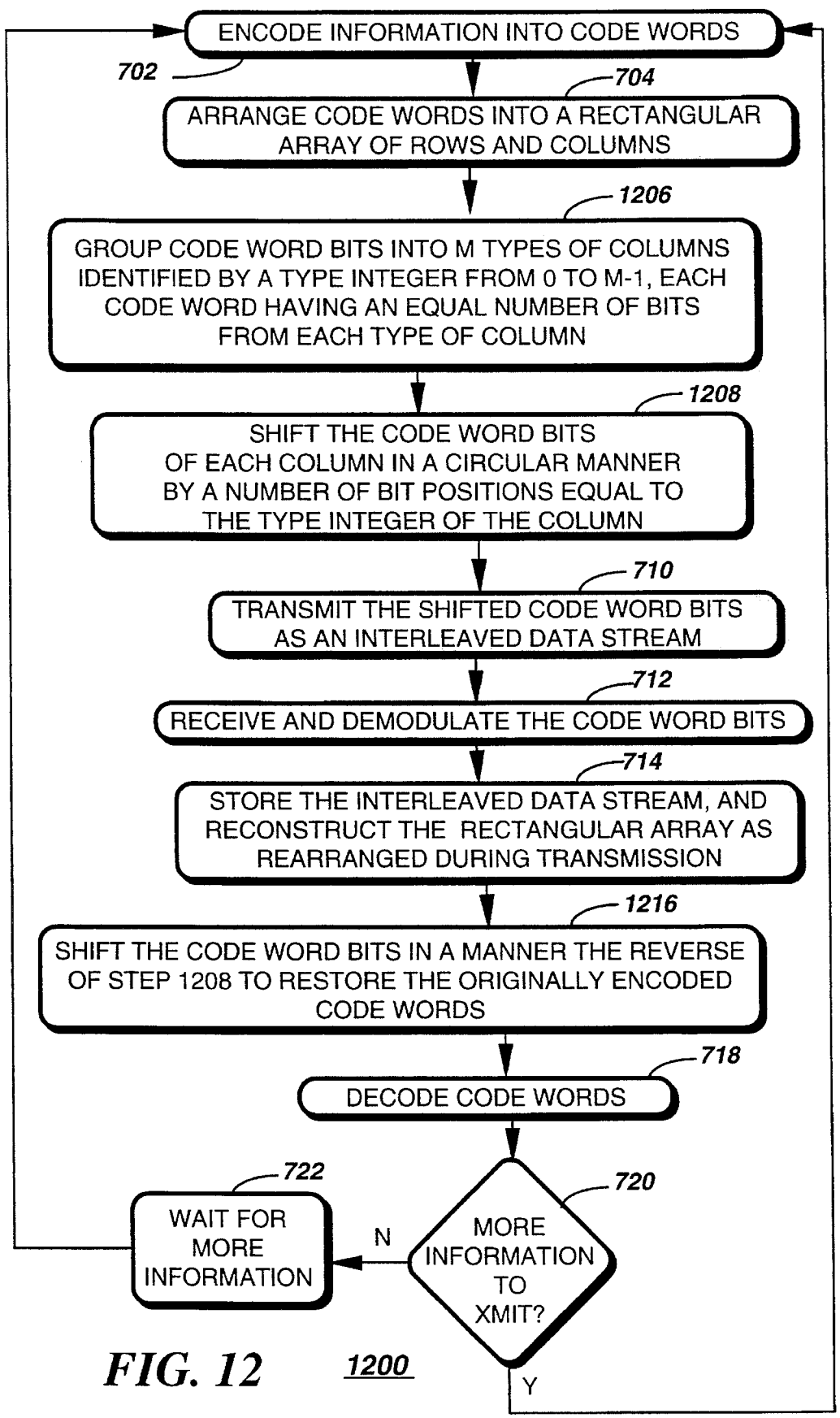
FIG. 12 is a flow chart depicting a method of encoding and decoding information in accordance with the alternative embodiment of the present invention.

With reference to FIG. 12, a flow chart 1200 depicts a method of encoding and decoding information in accordance with the alternative embodiment of the present invention.

The flow chart 1200 is similar to the flow chart 700, the essential differences being described below. After the code words have been arranged into a rectangular array in step 704, the processor 204 accesses the grouper 220 to group 1206 the code word bits preferably into M types of columns identified by a type integer from 0 to M-1. The grouping is performed such that each code word has an equal number of bits from each type of column. Then the processor 204 accesses the mover 222 and the rotator 223 to circularly shift 1208 the code word bits of each column having a type integer greater than zero by a number of bit positions equal to the type integer of the column.

It should be appreciated by now that the present invention provides a method and apparatus for interleaving the transmission of code word bits that utilizes a rectangular array size consistent with efficiency of data processing, while preventing a single symbol bit position from being used exclusively for transmitting any of the code words. The method and apparatus advantageously provide an even distribution of the symbol bit positions for transmitting each code word.

We claim:

1. A method for encoding and decoding information in a digital communication system utilizing at least four modulation levels for transmitting said information as symbols, each symbol representing a plurality of symbol bits positioned in a plurality of symbol bit positions, at least one of which exhibits an error rate higher than that of another of the plurality of symbol bit positions, the method comprising the steps of:

encoding said information into an even-numbered plurality of code words comprising a plurality of code word bits positioned in a plurality of code word bit positions;

transmitting said even-numbered plurality of code words as an interleaved data stream, wherein a transmission order of said plurality of code word bits is rearranged in a predetermined way to form a modified transmission order such that said plurality of code word bits corresponding to each of said plurality of code words are transmitted with substantially equal distribution in each of said plurality of symbol bit positions;

receiving said interleaved data stream to derive said plurality of code word bits;

reordering said plurality of code word bits after reception to undo bit modifications resulting from the modified transmission order, thereby restoring said plurality of code words; and decoding said plurality of code words after restoration to recover said information.

2. The method of claim 1, wherein said transmitting step comprises the steps of:

arranging said plurality of code words into a rectangular array of rows and columns, wherein each of said plurality of code words forms one of the rows of said rectangular array, and wherein said plurality of code word bits form the columns of said rectangular array, each column corresponding to one of said plurality of code word bit positions;

shifting, in a predetermined manner, said plurality of code word bits within portions of the columns to new positions in order to rearrange said plurality of code word bits; and sending said plurality of code word bits, as rearranged, in column-by-column order, wherein within a transmission of a column said plurality of code word bits of the column are transmitted in a linear row-by-row order.

3. The method of claim 2, wherein the digital communication system utilizes $2^M$ modulation levels, and wherein each symbol represents M symbol bits in M symbol bit positions, and wherein said step of shifting comprises the steps of:

grouping said plurality of code word bits into M types of groups, each of said M types of groups identified by a type integer ranging from 0 through M-1, each group consisting of a portion of said plurality of code word bits that are transmitted in a single symbol, and each of said plurality of code words having a substantially equal number of said plurality of code word bits from each of the M types of groups; and moving, in a circular manner within each group, said portion of said plurality of code word bits in the group by a number of bit positions, wherein said number of bit positions is equal to the type integer of the group.

4. The method of claim 2, wherein said reordering step comprises the steps of:

storing said interleaved data stream after reception in a manner that reconstructs said rectangular array comprising said plurality of code word bits as rearranged during transmission; and shifting, in a manner that is a reverse of said predetermined manner, said plurality of code word bits within said portions of the columns to restore original bit positions, thereby restoring said plurality of code words.

5. The method of claim 2, wherein the digital communication system utilizes $2^M$ modulation levels, and wherein each symbol represents M symbol bits in M symbol bit positions, and wherein said step of shifting comprises the steps of:

grouping said plurality of code word bits into M types of groups, each of said M types of groups identified by a type integer ranging from 0 through M-1, each group consisting of a columnar portion of said plurality of code word bits that comprises an integer multiple of eight bits, and each of said plurality of code words having a substantially equal number of said plurality of code word bits from each of the M types of groups; and moving, in a circular manner within each group, said portion of said plurality of code word bits in the group by a number of bit positions, wherein said number of bit positions is equal to the type integer of the group.

6. The method of claim 5, wherein ones of said M types of groups correspond to the columns of said rectangular array, and wherein said sending step comprises sending said plurality of code word bits of the columns identified by a lower type integer before sending said plurality of code word bits of the columns identified by a higher type integer, and wherein each of the columns is defined to have N uppermost bits, N being equal to the type integer of the column, and wherein said moving step comprises moving said portion of said plurality of code word bits upward within each column identified by a type integer greater than zero, except for the N uppermost bits of each column, said N uppermost bits being rotated to a lowermost position in the column.

7. A digital communication system for encoding and decoding information, the digital communication system utilizing at least four modulation levels for transmitting said information as symbols, each symbol representing a plurality of symbol bits positioned in a plurality of symbol bit positions, at least one of which exhibits an error rate higher than that of another of the plurality of symbol bit positions, the digital communication system comprising:

an encoder for encoding said information into an even-numbered plurality of code words comprising a plurality of code word bits positioned in a plurality of code word bit positions;

an interleaver coupled to said encoder for transmitting said even-numbered plurality of code words as an interleaved data stream, wherein a transmission order of said plurality of code word bits is rearranged in a predetermined way to form a modified transmission order such that said plurality of code word bits corresponding to each of said plurality of code words are transmitted with substantially equal distribution in each of said plurality of symbol bit positions;

a receiver coupled to said interleaver for receiving said interleaved data stream to derive said plurality of code word bits;

a reorderer coupled to said receiver for reordering said plurality of code word bits after reception to undo bit modifications resulting from the modified transmission order, thereby restoring said plurality of code words; and a decoder coupled to said reorderer for decoding said plurality of code words after restoration to recover said information.

8. The digital communication system of claim 7, wherein said interleaver comprises:

an arranger for arranging said plurality of code words into a rectangular array of rows and columns, wherein each of said plurality of code words forms one of the rows of said rectangular array, and wherein said plurality of code word bits form the columns of said rectangular array, each column corresponding to one of said plurality of code word bit positions;

a shifter coupled to said arranger for shifting, in a predetermined manner, said plurality of code word bits within portions of the columns to new positions in order to rearrange said plurality of code word bits; and a sender coupled to said shifter for sending said plurality of code word bits, as rearranged, in column-by-column order, wherein within a transmission of a column said plurality of code word bits of the column are transmitted in a linear row-by-row order.

9. The digital communication system of claim 8, wherein the digital communication system utilizes $2^M$ modulation levels, and wherein each symbol represents M symbol bits in M symbol bit positions, and wherein said shifter comprises:

a grouper for grouping said plurality of code word bits into M types of groups, each of said M types of groups identified by a type integer ranging from 0 through M-1, each group consisting of a portion of said plurality of code word bits that are transmitted in a single symbol, and each of said plurality of code words having a substantially equal number of said plurality of code word bits from each of the M types of groups; and a mover coupled to said grouper for moving, in a circular manner within each group, said portion of said plurality of code word bits in the group by a number of bit positions, wherein said number of bit positions is equal to the type integer of the group.

10. The digital communication system of claim 8, wherein said reorderer comprises:

a storer for storing said interleaved data stream after reception in a manner that reconstructs said rectangular array comprising said plurality of code word bits as rearranged during transmission; and a reverse shifter coupled to said storer for shifting, in a manner that is a reverse of said predetermined manner, said plurality of code word bits within said portions of the columns to restore original bit positions, thereby restoring said plurality of code words.

11. The digital communication system of claim 8, wherein the digital communication system utilizes $2^M$ modulation levels, and wherein each symbol represents M symbol bits in M symbol bit positions, and wherein said shifter comprises:

a grouper for grouping said plurality of code word bits into M types of groups, each of said M types of groups identified by a type integer ranging from 0 through M-1, each group consisting of a columnar portion of said plurality of code word bits that comprises an integer multiple of eight bits, and each of said plurality of code words having a substantially equal number of said plurality of code word bits from each of the M types of groups; and a mover coupled to said grouper for moving, in a circular manner within each group, said portion of said plurality of code word bits in the group by a number of bit positions, wherein said number of bit positions is equal to the type integer of the group.

12. The digital communication system of claim 11, wherein ones of said M types of groups correspond to the columns of said rectangular array, and wherein said sender comprises an orderer for sending said plurality of code word bits of the columns identified by a lower type integer before sending said plurality of code word bits of the columns identified by a higher type integer, and wherein each of the columns is defined to have N uppermost bits, N being equal to the type integer of the column, and wherein said mover comprises a rotator for moving said portion of said plurality of code word bits upward within each column identified by a type integer greater than zero, except for the N uppermost bits of each column, said N uppermost bits being rotated to a lowermost position in the column.

13. A controller for encoding information in a digital communication system utilizing at least four modulation levels for transmitting said information as symbols, each symbol representing a plurality of symbol bits positioned in a plurality of symbol bit positions, at least one of which exhibits an error rate higher than that of another of the plurality of symbol bit positions, the controller comprising:

an encoder for encoding said information into an even-numbered plurality of code words comprising a plurality of code word bits positioned in a plurality of code word bit positions; and an interleaver coupled to said encoder for transmitting said even-numbered plurality of code words as an interleaved data stream, wherein a transmission order of said plurality of code word bits is rearranged in a predetermined way to form a modified transmission order such that said plurality of code word bits corresponding to each of said plurality of code words are transmitted with substantially equal distribution in each of said plurality of symbol bit positions.

14. The controller of claim 13, wherein said interleaver comprises:

an arranger for arranging said plurality of code words into a rectangular array of rows and columns, wherein each of said plurality of code words forms one of the rows of said rectangular array, and wherein said plurality of code word bits form the columns of said rectangular array, each column corresponding to one of said plurality of code word bit positions;

a shifter coupled to said arranger for shifting, in a predetermined manner, said plurality of code word bits within portions of the columns to new positions in order to rearrange said plurality of code word bits; and a sender coupled to said shifter for sending said plurality of code word bits, as rearranged, in column-by-column order, wherein within a transmission of a column said plurality of code word bits of the column are transmitted in a linear row-by-row order.

15. The controller of claim 14, wherein the digital communication system utilizes $2^M$ modulation levels, and wherein each symbol represents M symbol bits in M symbol bit positions, and wherein said shifter comprises:

a grouper for grouping said plurality of code word bits into M types of groups, each of said M types of groups identified by a type integer ranging from 0 through M-1, each group consisting of a portion of said plurality of code word bits that are transmitted in a single symbol, and each of said plurality of code words having a substantially equal number of said plurality of code word bits from each of the M types of groups; and a mover coupled to said grouper for moving, in a circular manner within each group, said portion of said plurality of code word bits in the group by a number of bit positions, wherein said number of bit positions is equal to the type integer of the group.

16. The controller of claim 14, wherein the digital communication system utilizes $2^M$ modulation levels, and wherein each symbol represents M symbol bits in M symbol bit positions, and wherein said shifter comprises:

a grouper for grouping said plurality of code word bits into M types of groups, each of said M types of groups identified by a type integer ranging from 0 through M-1, each group consisting of a columnar portion of said plurality of code word bits that comprises an integer multiple of eight bits, and each of said plurality of code words having a substantially equal number of said plurality of code word bits from each of the M types of groups; and a mover coupled to said grouper for moving, in a circular manner within each group, said portion of said plurality of code word bits in the group by a number of bit positions, wherein said number of bit positions is equal to the type integer of the group.

17. The controller of claim 16, wherein ones of said M types of groups correspond to the columns of said rectangular array, and wherein said sender comprises an orderer for sending said plurality of code word bits of the columns identified by a lower type integer before sending said plurality of code word bits of the columns identified by a higher type integer, and wherein each of the columns is defined to have N uppermost bits, N being equal to the type integer of the column, and wherein said mover comprises a rotator for moving said portion of said plurality of code word bits upward within each column identified by a type integer greater than zero, except for the N uppermost bits of each column, said N uppermost bits being rotated to a lowermost position in the column.

18. A communication receiver for decoding information in a digital communication system utilizing at least four modulation levels for transmitting said information as symbols, each symbol representing a plurality of symbol bits positioned in a plurality of symbol bit positions, at least one of which exhibits an error rate higher than that of another of the plurality of symbol bit positions, wherein the digital communication system comprises an encoder for encoding said information into an even-numbered plurality of code words comprising a plurality of code word bits positioned in a plurality of code word bit positions, and wherein the digital communication system further comprises an interleaver coupled to said encoder for transmitting said even-numbered plurality of code words as an interleaved data stream, and wherein a transmission order of said plurality of code word bits is rearranged in a predetermined way to form a modified transmission order such that said plurality of code word bits corresponding to each of said plurality of code words are transmitted with substantially equal distribution in each of said plurality of symbol bit positions, the communication receiver comprising:

a receiver coupled to said interleaver for receiving said interleaved data stream to derive said plurality of code word bits;

a reorderer coupled to said receiver for reordering said plurality of code word bits after reception to undo bit modifications resulting from the modified transmission order, thereby restoring said plurality of code words; and a decoder coupled to said reorderer for decoding said plurality of code words after restoration to recover said information.

19. The communication receiver of claim 18, wherein the interleaver of the digital communication system comprises an arranger for arranging said plurality of code words into a rectangular array of rows and columns, and wherein each of said plurality of code words forms one of the rows of said rectangular array, and wherein said plurality of code word bits form the columns of said rectangular array, each column corresponding to one of said plurality of code word bit positions, and wherein the interleaver further comprises a shifter coupled to the arranger for shifting, in a predetermined manner, said plurality of code word bits within portions of the columns to new positions in order to rearrange said plurality of code word bits, and wherein said reorderer comprises:

a storer for storing said interleaved data stream after reception in a manner that reconstructs said rectangular array comprising said plurality of code word bits as rearranged during transmission; and a reverse shifter coupled to said storer for shifting, in a manner that is a reverse of said predetermined manner, said plurality of code word bits within said portions of the columns to restore original bit positions, thereby restoring said plurality of code words.

* * * * *

UNITED STATES PATENT AND TRADEMARK OFFICE
CERTIFICATE OF CORRECTION

PATENT NO. : 5,602,875
DATED : February 11, 1997
INVENTOR(S) : G. David Mantel, Gregory L. Cannon, R. Louis Breeden It is certified that error appears in the above-indentified patent and that said Letters Patent is hereby corrected as shown below:

On title page, item [54] and Column 1, line 3

In the Title, Line 3, "Digtial" should be changed to --Digital--.

Signed and Sealed this

Twenty-eighth Day of July, 1998

Attest:

BRUCE LEHMAN

Attesting Officer

Commissioner of Patents and Trademarks